US012772841B2

(12) United States Patent
Choi

(10) Patent No.: US 12,772,841 B2
(45) Date of Patent: Oct. 20, 2026

(54) SEMICONDUCTOR PACKAGE AND METHOD OF FABRICATING THE SAME

(71) Applicant: JMJ Korea Co., Ltd., Busan (KR)

(72) Inventor: Yun Hwa Choi, Busan (KR)

(73) Assignee: JMJ Korea Co., Ltd., Busan (KR)

( * ) Notice: Subject to any disclaimer, the term of this patent is extended or adjusted under 35 U.S.C. 154(b) by 555 days.

(21) Appl. No.: 18/099,921

(22) Filed: Jan. 21, 2023

(65) Prior Publication Data

US 2023/0238297 A1 Jul. 27, 2023

(30) Foreign Application Priority Data

Jan. 26, 2022 (KR) ........................ 10-2022-0011343

(51) Int. Cl.

| | |
|---|---|
| ***H10W 40/22*** | (2026.01) |
| ***H10W 40/25*** | (2026.01) |
| ***H10W 40/40*** | (2026.01) |
| ***H10W 70/60*** | (2026.01) |
| ***H10W 76/12*** | (2026.01) |
| ***H10W 90/00*** | (2026.01) |

(52) U.S. Cl.

CPC ......... *H10W 40/22* (2026.01); *H10W 40/255* (2026.01); *H10W 40/40* (2026.01); *H10W 70/611* (2026.01); *H10W 76/161* (2026.01); *H10W 90/00* (2026.01); *H10W 90/401* (2026.01); *H10W 90/701* (2026.01)

(58) Field of Classification Search

None

See application file for complete search history.

(56) References Cited

U.S. PATENT DOCUMENTS

| | | | | |
|---|---|---|---|---|
| 2010/0208427 | A1* | 8/2010 | Horiuchi | H05K 7/20927 361/699 |
| 2013/0113115 | A1* | 5/2013 | Wang | H10W 70/695 438/109 |
| 2015/0085446 | A1* | 3/2015 | Hable | H05K 1/021 29/841 |
| 2020/0006170 | A1* | 1/2020 | Nunokawa | H01L 23/49838 |
| 2020/0388556 | A1* | 12/2020 | Tsuyuno | H01L 23/49562 |

FOREIGN PATENT DOCUMENTS

| | | | |
|---|---|---|---|
| CN | 113921409 | A | 1/2022 |
| JP | 2010-087438 | A | 4/2010 |
| JP | 2010-192708 | A | 9/2010 |
| KR | 10-2010-0039719 | A | 4/2010 |
| KR | 10-1694657 | B1 | 1/2017 |
| KR | 10-1899788 | B1 | 11/2018 |
| KR | 10-1920915 | B1 | 11/2018 |
| KR | 10-2021-0108583 | A | 9/2021 |

* cited by examiner

*Primary Examiner* — Brent A. Fairbanks
*Assistant Examiner* — Derek L Nielsen
(74) *Attorney, Agent, or Firm* — Park, Kim & Suh, LLC

(57) ABSTRACT

Provided is a semiconductor package and a method of manufacturing the same, wherein in the semiconductor package, an area on a surface of a heat release metal layer pressed by a molding die is expanded and the molding die directly and uniformly compresses an upper substrate and/or a lower substrate, each of which does not include heat release posts so that contamination of a substrate occurring due to a molding resin may be prevented and molding may be stably performed.

16 Claims, 8 Drawing Sheets

(a)

(b)

(a)

(b)

(c)

(d)

(e)

SEMICONDUCTOR PACKAGE AND METHOD OF FABRICATING THE SAME

CROSS-REFERENCE TO RELATED PATENT APPLICATION

This application claims the benefit of Korean Patent Application No. 10-2022-0011343, filed on Jan. 26, 2022, in the Korean Intellectual Property Office, the disclosure of which is incorporated herein in its entirety by reference.

TECHNICAL FIELD

The present invention relates to a semiconductor package and a method of manufacturing the same, wherein in the semiconductor package, an area on a surface of a heat release metal layer pressed by a molding die is expanded and the molding die directly and uniformly compresses an upper substrate and/or a lower substrate, each of which does not include heat release posts so that contamination of a substrate occurring due to a molding resin may be prevented and molding may be stably performed.

BACKGROUND ART

In general, a semiconductor package includes a semiconductor chip installed on a lower substrate and/or an upper substrate, a conductor which is a metal post functioning as a space bonded onto the semiconductor chip, a lead frame applying an electrical signal from the outside, a package housing molded by a sealing member, and heat release posts exposed to the lower substrate and/or the upper substrate. Referring to FIG. 1A, while a package housing 10 is molded, mold dies 20 only press a part of heat release metal layers 31 and 41, for example, the edges, by avoiding heat release posts 32 and 42 of a lower substrate 30 and/or an upper substrate 40. Accordingly, the package housing 10 is formed.

When the package housing 10 is formed as described above, pressurization from the mold die 20 is not uniform and a pressing force applied to the heat release metal layers 31 and 41 is weakened as illustrated in FIG. 1B. Accordingly, a molding resin 11 overflows toward the heat release metal layers 31 and 41 and thus, the substrate is contaminated so as to affect stability and reliability of the semiconductor package.

In this regard, there is a demand for the technique that may expand and uniformly compress an area on a surface of a heat release metal layer pressed by a molding die so as to prevent contamination of the substrate occurring due to a molding resin and to stably perform molding.

DISCLOSURE

Technical Problem

The present invention provides a semiconductor package and a method of manufacturing the same, wherein in the semiconductor package, an area on a surface of a heat release metal layer pressed by a molding die is expanded and the molding die directly and uniformly compresses an upper substrate and/or a lower substrate, each of which does not include heat release posts, so that contamination of a substrate occurring due to a molding resin may be prevented and molding may be stably performed.

Technical Solution

According to an aspect of the present invention, there is provided a semiconductor package including: an upper substrate or a lower substrate each of which comprises a plurality of heat release posts protruded and arranged thereon; semiconductor chips joined onto the upper substrate or the lower substrate and connected by electrical signal lines; lead frames electrically connected to the upper substrate or the lower substrate; and a molding housing partially or entirely covering a region of the upper substrate or the lower substrate to which the semiconductor chips are not joined, wherein the heat release posts are extended from the lower surface, the upper surface, or the lower and upper surfaces of the upper substrate or the lower substrate and exposed to the surface of the molding housing by a certain height, one or more mold distances D2 interposed between the heat release posts, which directly contact the upper substrate or the lower substrate by the molding die, are greater than one or more post distances D1 interposed between the heat release posts, lines arranged for the surface of the molding die to contact the upper substrate or the lower substrate include any one of a penetration line L1 and a nonpenetration line L2, wherein the penetration line L1 entirely penetrates the surface of the upper substrate in a horizontal direction, the surface of the lower substrate in a horizontal direction, or each surface on the upper substrate and the lower substrate in a horizontal direction, and the nonpenetration line L2 is blocked by the heat release posts and thereby, does not partially penetrate the surface of the upper substrate in a horizontal direction, the surface of the lower substrate in a horizontal direction, or each surface on the upper substrate and the lower substrate in a horizontal direction.

The mold distances D2 may be greater than the post distances D1 by two times or above.

The mold distances D2 may be in the range of 1 mm through 300 mm.

The heat release posts may be formed in circular columns, elliptic cylinders, or polygonal columns.

The heat release posts may be formed of a metal or contain 40% or more of a metal component.

The upper substrate or the lower substrate may include one or more insulating layers.

The upper substrate or the lower substrate may include one or more heat release metal layers, on which the heat release posts are arranged, one or more insulating layers on the heat release metal layers, one or more metal pattern layers electrically connected to the semiconductor chips on the insulating layers, and one or more conductive bonding layers formed on the upper surface or the lower surface of the semiconductor chips.

The heat release posts may be formed of a material which is same as that of the heat release metal layers.

The electrical signal lines may be surface-bonding type conductive clips or post-shaped conductive spacers.

The molding housing may be formed of an Epoxy Molding Compound (EMC).

The heat release posts may include a semiconductor cooling system joined to the upper part or the lower part thereof and a coolant circulating the semiconductor cooling system directly may contact the heat release posts.

The coolant may include cooling water, a coolant fluid, refrigerant gas, or air.

The insulating layers may be formed of a single material comprising $Al_2O_3$, AlN, $Si_3N_4$, or SiC or a composite material including any one of $Al_2O_3$, AlN, $Si_3N_4$, and SiC.

The semiconductor chips may be applied to on board chargers (OBC), inverters, or converters.

According to another aspect of the present invention, there is provided a method of manufacturing a semiconductor package including: preparing an upper substrate or a lower substrate each of which comprises a plurality of heat release posts protruded and arranged thereon; joining semiconductor chips on the upper substrate or the lower substrate and connecting together by using electrical signal lines; electrically connecting lead frames to the upper substrate or the lower substrate; and partially or entirely covering a region of the upper substrate or the lower substrate, to which the semiconductor chips are not joined, with a molding housing, wherein the heat release posts are extended from the lower surface, the upper surface, or the lower and upper surfaces of the upper substrate or the lower substrate and exposed to the surface of the molding housing by a certain height, one or more mold distances D2 interposed between the heat release posts, which directly contact the upper substrate or the lower substrate by the molding die, are greater than one or more post distances D1 interposed between the heat release posts, lines arranged for the surface of the molding die to contact the upper substrate or the lower substrate include any one of a penetration line L1 and a nonpenetration line L2, wherein the penetration line L1 entirely penetrates the surface of the upper substrate in a horizontal direction, the surface of the lower substrate in a horizontal direction, or each surface on the upper substrate and the lower substrate in a horizontal direction, and the nonpenetration line L2 is blocked by the heat release posts and thereby, does not partially penetrate the surface of the upper substrate in a horizontal direction, the surface of the lower substrate in a horizontal direction, or each surface on the upper substrate and the lower substrate in a horizontal direction, and wherein while the molding housing is molded by the molding die, the molding die compresses one or more penetration lines L1 or one or more nonpenetration lines L2 to form the molding housing.

The mold distances D2 may be greater than the post distances D1 by two times or above.

The mold distances D2 may be in the range of 1 mm through 300 mm.

The heat release posts may be formed of a metal or contain 40% or more of a metal component.

The upper substrate or the lower substrate may include one or more heat release metal layers, on which the heat release posts are arranged, one or more insulating layers on the heat release metal layers, one or more metal pattern layers electrically connected to the semiconductor chips on the insulating layers, and one or more conductive bonding layers formed on the upper surface or the lower surface of the semiconductor chips.

The heat release posts may be formed of a material which is same as that of the heat release metal layers.

Advantageous Effects

According to the present invention, areas on the surfaces of the heat release metal layers pressed by the molding die are expanded and the molding die directly and uniformly compresses the upper substrate and/or the lower substrate, each of which does not include the heat release posts, so that contamination of the substrate occurring due to a molding resin may be prevented and molding may be stably performed.

MODE FOR INVENTION

Figure 1:
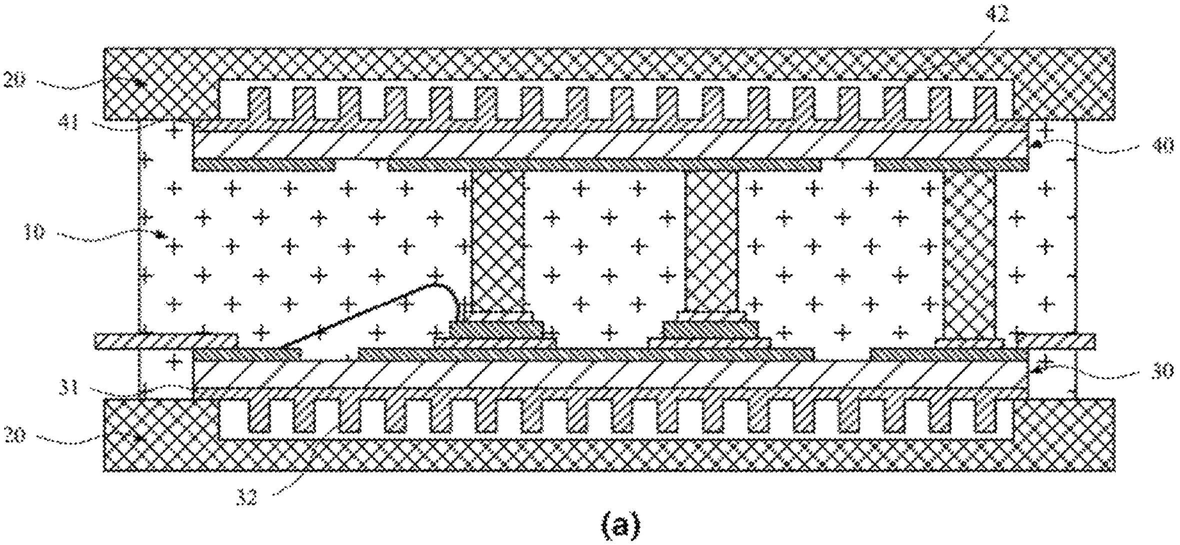
FIG. 1 illustrates a semiconductor package according to a prior art.
Figure 1:
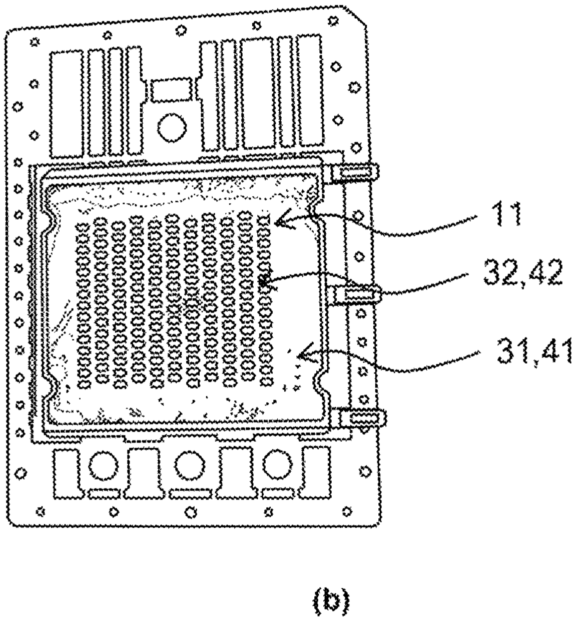

Hereinafter, embodiments of the present invention will be described in more detail with reference to the accompanying drawings.

A semiconductor package according to an embodiment of the present invention includes an upper substrate 110 and/or a lower substrate 120 each of which includes a plurality of heat release posts 111 and 121 protruded and arranged thereon, semiconductor chips 130 joined onto the upper substrate 110 and/or the lower substrate 120 and connected by electrical signal lines 131, lead frames 140 electrically connected to the upper substrate 110 and/or the lower substrate 120, and a molding housing 150 partially or entirely covering a region of the upper substrate 110 and/or the lower substrate 120 to which the semiconductor chips 130 are not joined. Here, the heat release posts 111 and 121 are extended from the lower surface, the upper surface, or the lower and upper surfaces of the upper substrate 110 and/or the lower substrate 120 and exposed to the surface of the molding housing 150 by a certain height. Also, mold distances D2 within a molding die 160 used to shape the molding housing 150 is greater than post distances D1 between the heat release posts 111 and 121. Lines arranged for the surface of the molding die 160 to contact the upper substrate 110 or the lower substrate 120 include a penetration line L1 and/or a nonpenetration line L2, wherein the penetration line L1 entirely penetrates the surfaces of the upper substrate 110 and/or the lower substrate 120 in a horizontal direction, and the nonpenetration line L2 is blocked by the heat release posts 111 and 121 and thereby, does not partially penetrate the surfaces of the upper substrate 110 and/or the lower substrate 120 in a horizontal direction. Accordingly, the molding die 160 may directly and uniformly compress the upper substrate 110 and/or the lower substrate 120 where the heat release posts 111 and 121 are not arranged.

Hereinafter, the semiconductor package described above will be described in more detail with reference to FIGS. 2 through 9.

Figure 2:
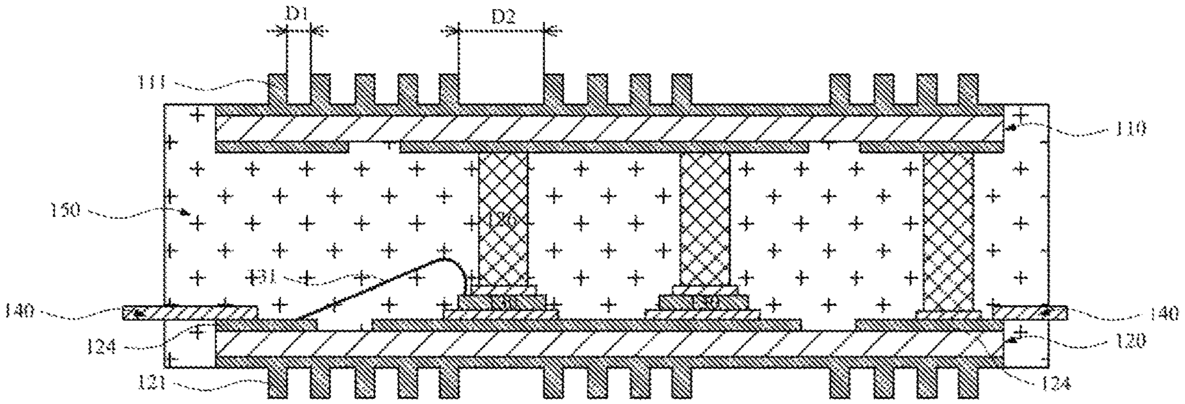
FIG. 2 is a cross-sectional view of a semiconductor package according to an embodiment of the present invention.
Figure 3:
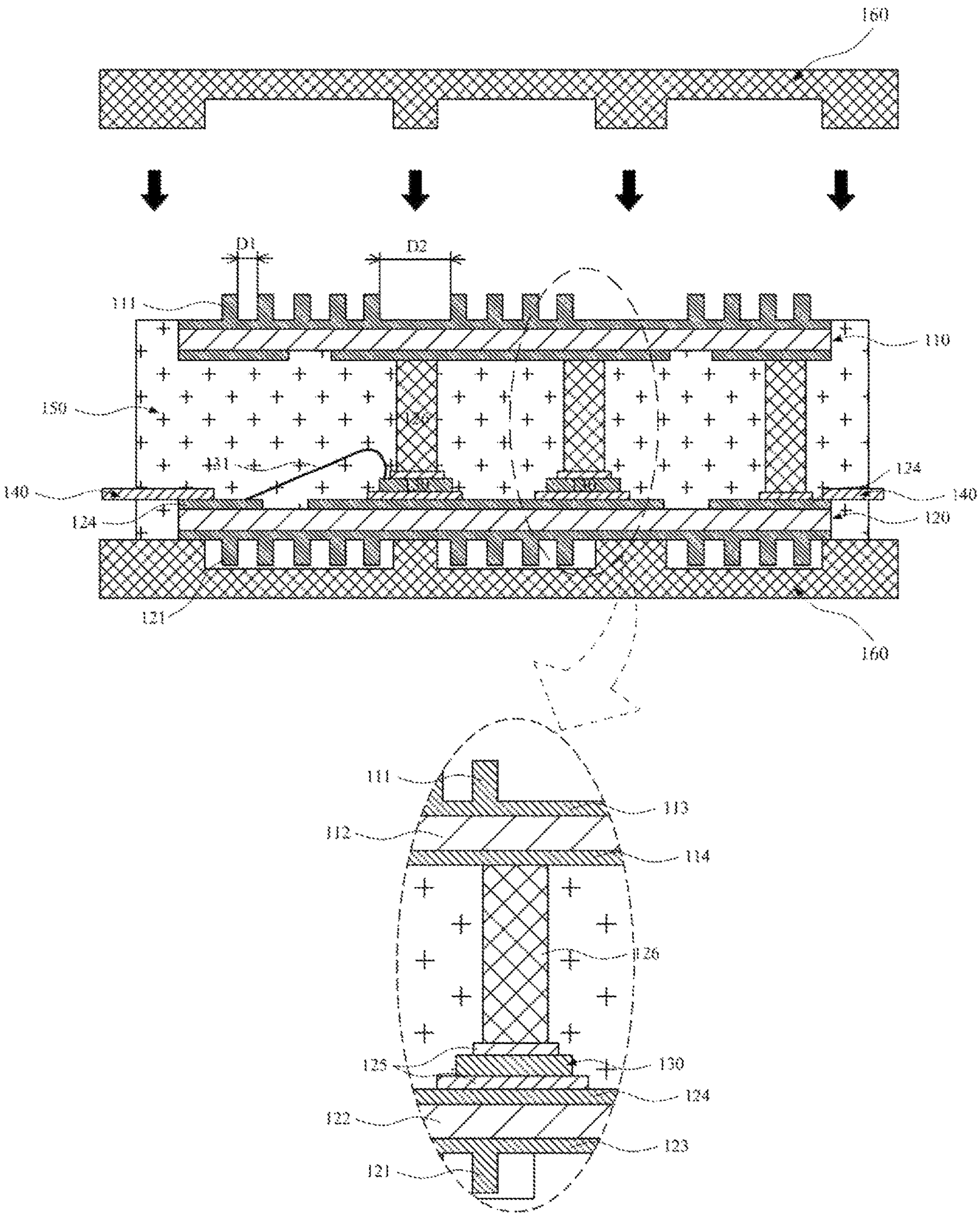
FIG. 3 illustrates a joining structure between a substrate of the semiconductor package in FIG. 2 and a molding die.

First, referring to FIGS. 2 and 3, the plurality of heat release posts 111 and 121 used to radiate heat is protruded from and arranged on the surface of the upper substrate 110 or the lower substrate 120 and thereby, heat transmitted from the upper substrate 110 or the lower substrate 120 is radiated to the outside.

Here, the heat release posts 111 and 121 are extended from the lower surface, the upper surface, or the upper and lower surfaces of the upper substrate 110 and/or the lower substrate 120 and stand upright by being uniformly exposed to the surface of the molding housing 150 at a certain height.

Figure 8:
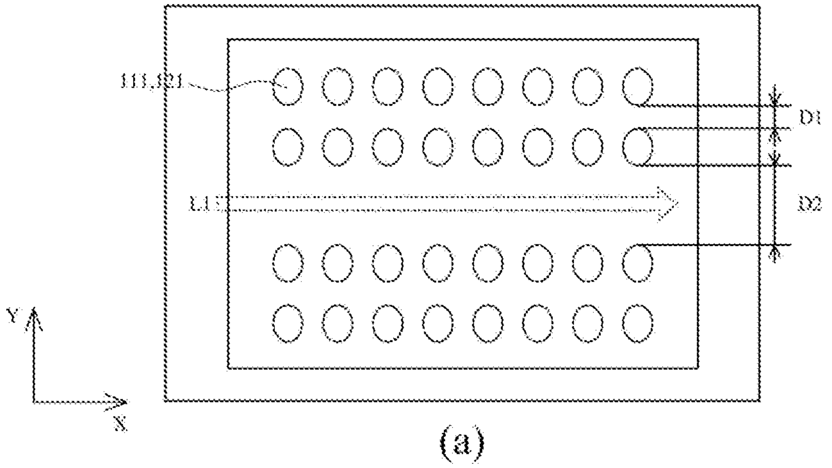
FIGS. 8 and 9 illustrate various examples of penetration lines and non-penetration lines in the semiconductor package of FIG. 2.
Figure 8:
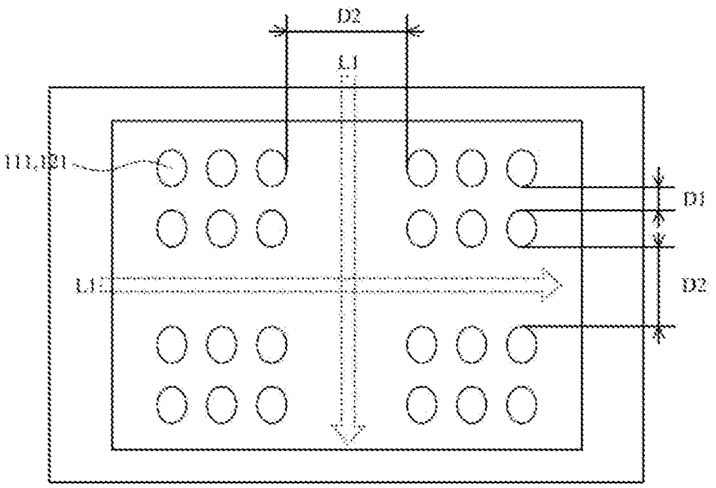
Figure 8:
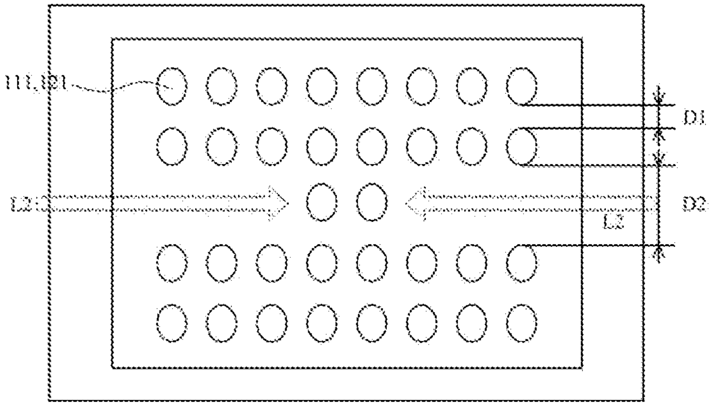
Figure 9:
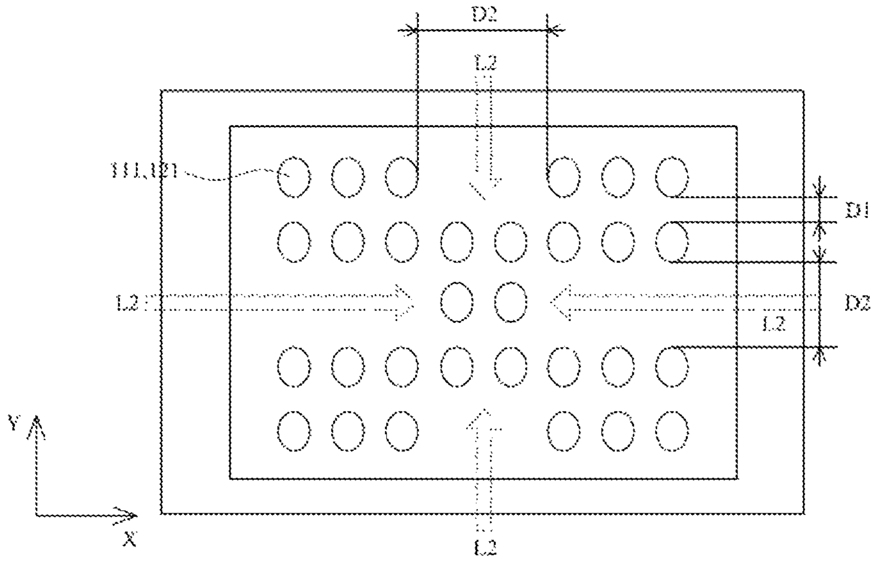
Figure 9:
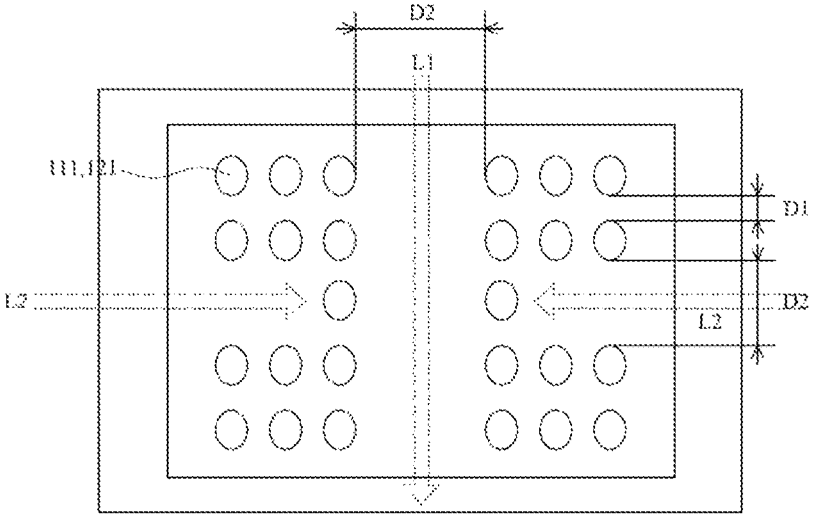

Also, in regard to the arrangement of the heat release posts 111 and 121 as illustrated in FIGS. 2 and 3, one or more mold distances D2 interposed between the heat release posts 111 and 121, which directly contact the upper substrate 110 and/or the lower substrate 120 by the molding die 160, are greater than one or more post distances D1 interposed between the heat release posts 111 and 121. In addition, as illustrated in FIGS. 8 and 9, lines arranged for the surface of the molding die 160 to contact the upper substrate 110 or the lower substrate 120 may include the penetration line L1 and/or the nonpenetration line L2, wherein the penetration line L1 entirely penetrates the surface of the upper substrate in a horizontal direction, the surface of the lower substrate in a horizontal direction, or each surface on the upper substrate and the lower substrate in a horizontal direction, and the nonpenetration line L2 is blocked by the heat release posts 111 and 121 and thereby, does not partially penetrate the surface of the upper substrate in a horizontal direction, the surface of the lower substrate in a horizontal direction, or each surface on the upper substrate and the lower substrate in a horizontal direction.

In this regard, while the molding housing 150 is molded by the molding die 160, the molding die 160 may directly compress heat release metal layers 113 and 123 of the upper substrate 110 and/or the lower substrate 120 where the heat release posts 111 and 121 are not arranged. Accordingly, pressure applied to the substrates is raised and uniform and thus, a molding resin may be prevented from overflowing toward the surfaces of the heat release metal layers 113 and 123. Therefore, quality stability may be improved.

That is, compared with the arrangement where the heat release posts 111 and 121 are close to each other, areas on surfaces of the heat release metal layers 113 and 123 pressed by the molding die 160 may be expanded and molding may be stably performed by using the penetration line L1 and the nonpenetration line L2, where a part of the heat release posts 111 and 121 is removed for the surface of the molding die 160 to contact the upper substrate 110 or the lower substrate 120.

More specifically, various modifications are available for expanding the areas on the surfaces of the heat release metal layers 113 and 123 pressed by the molding die 160. Referring to FIG. 8A, the penetration line L1 may be formed in an X-axis direction based on the surface of the substrate. Referring to FIG. 8B, the penetration line L1 may be formed in an X-axis direction and a Y-axis direction based on the surface of the substrate. Referring to FIG. 8C, a pair of nonpenetration lines L2 facing each other may be formed in an X-axis direction based on the surface of the substrate. Referring to FIG. 9D, two pairs of nonpenetration lines L2 respectively facing each other may be each formed in an X-axis direction and a Y-axis direction based on the surface of the substrate. Referring to FIG. 9E, a pair of nonpenetration lines L2 facing each other may be formed in an X-axis direction and the penetration line L1 may be formed in a Y-axis direction. Also, in contrast to this, a pair of nonpenetration lines L2 facing each other may be formed in a Y-axis direction and the penetration line L1 may be formed in an X-axis direction.

The mold distances D2 are greater than the post distances D1 by two times or above and thus, the areas on the surfaces of the heat release metal layers 113 and 123, which may be sufficiently pressed by the molding die 160, may be secured. For example, the mold distances D2 may be in the range of 1 mm through 300 mm.

The heat release posts 111 and 121 may be formed in various forms such as circular columns, elliptic cylinders, or polygonal columns. Also, the heat release posts 111 and 121 may be formed of a metal having excellent thermal conductivity or may contain 40% or more of a metal component having excellent thermal conductivity. The heat release posts 111 and 121 may be formed of a material which is same as that of the heat release metal layers 113 and 123. For example, the heat release posts 111 and 121 may be formed of a single material including Cu or Al, an alloy material containing 50% or more of Cu or Al, or a ceramic material.

As illustrated in an enlarged view of FIG. 3, the upper substrate 110 and/or the lower substrate 120 may each include one or more insulating layers 112 and 122, wherein the insulating layers 112 and 122 may be formed of a single material including $Al_2O_3$, AlN, $Si_3N_4$, or SiC or a composite material including at least one of $Al_2O_3$, AlN, $Si_3N_4$, and SiC.

Also, the upper substrate 110 and/or the lower substrate 120 may include one or more heat release metal layers 113 and 123, on which the heat release posts 111 and 121 are respectively arranged, one or more insulating layers 112 and 122 respectively formed on the heat release metal layers 113 and 123, one or more metal pattern layers 114 and 124 formed on the insulating layers 112 and 122 and electrically connected to the semiconductor chips 130, and one or more conductive bonding layers 125 formed on the upper surface and/or the lower surface of the semiconductor chip 130.

Figure 4:
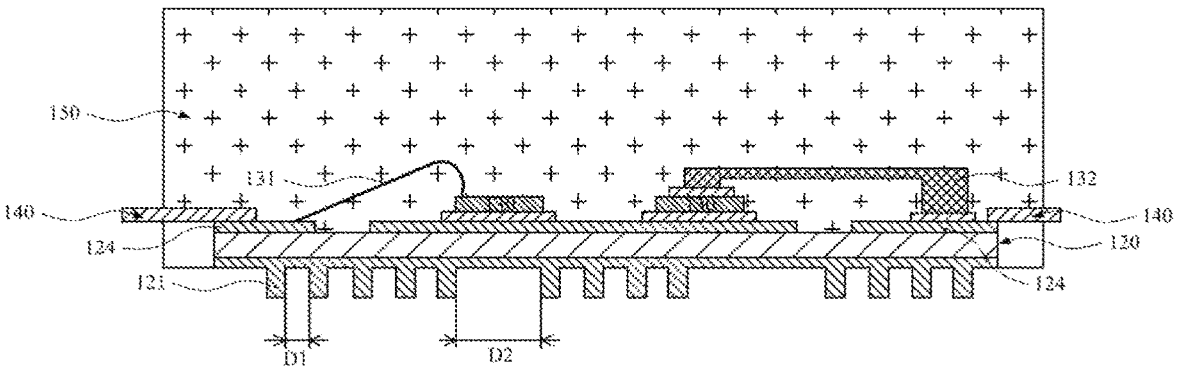
FIG. 4 is a cross-sectional view of the semiconductor package in FIG. 2 according to a second embodiment of the present invention.
Figure 5:
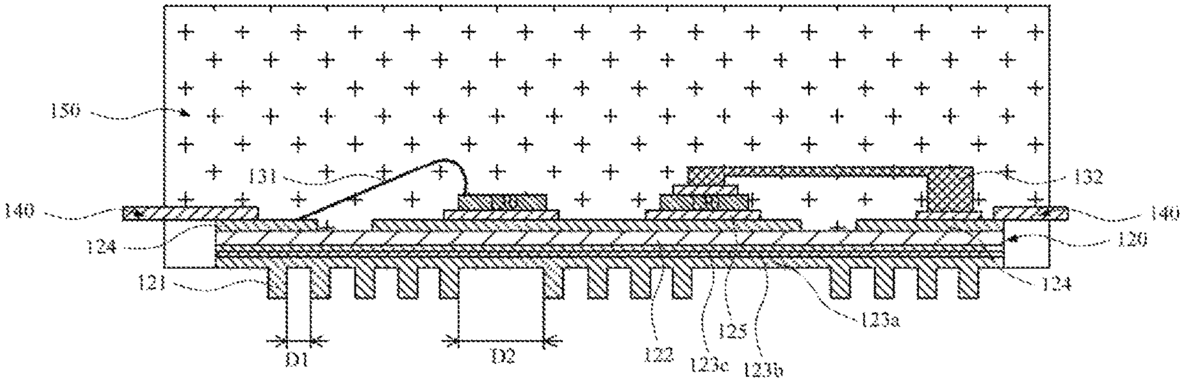
FIG. 5 is a cross-sectional view of the semiconductor package in FIG. 2 according to a third embodiment of the present invention.

The electrical signal lines 131, which electrically connect the semiconductor chips 130 to the metal pattern layers 114 and 124, may each be a wire, a surface-bonding type conductive clip 132 as in FIG. 4, or a post-shaped conductive spacer 126.

The heat release posts 111 and 121 may be exposed to one surface or both surfaces of the molding housing 150 according to a structure of the substrate including a single-sided substrate or a both-sided substrate. For example, referring to FIG. 5, the lower substrate 120 may include one or more first heat release metal layers 123*a*, on which the heat release posts 121 are arranged, a second heat release metal layer 123*c* formed by joining a bonding layer 123*b* on the first heat release metal layer 123*a*, one or more insulating layers 122, one or more metal pattern layers 124 electrically connected to the semiconductor chips 130 on the insulating layers 122, and one or more conductive bonding layers 125 formed on the upper surface or the lower surface of the semiconductor chips 130.

Figure 6:
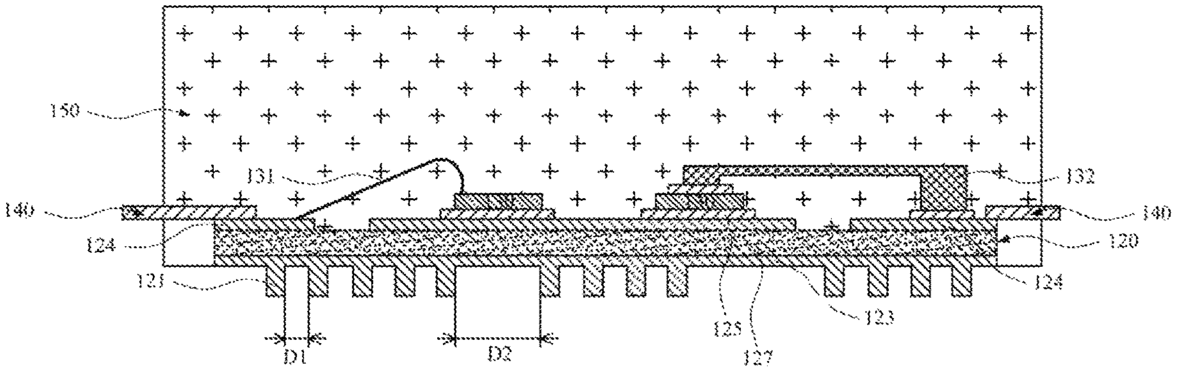
FIG. 6 is a cross-sectional view of the semiconductor package in FIG. 2 according to a fourth embodiment of the present invention.
Figure 7:
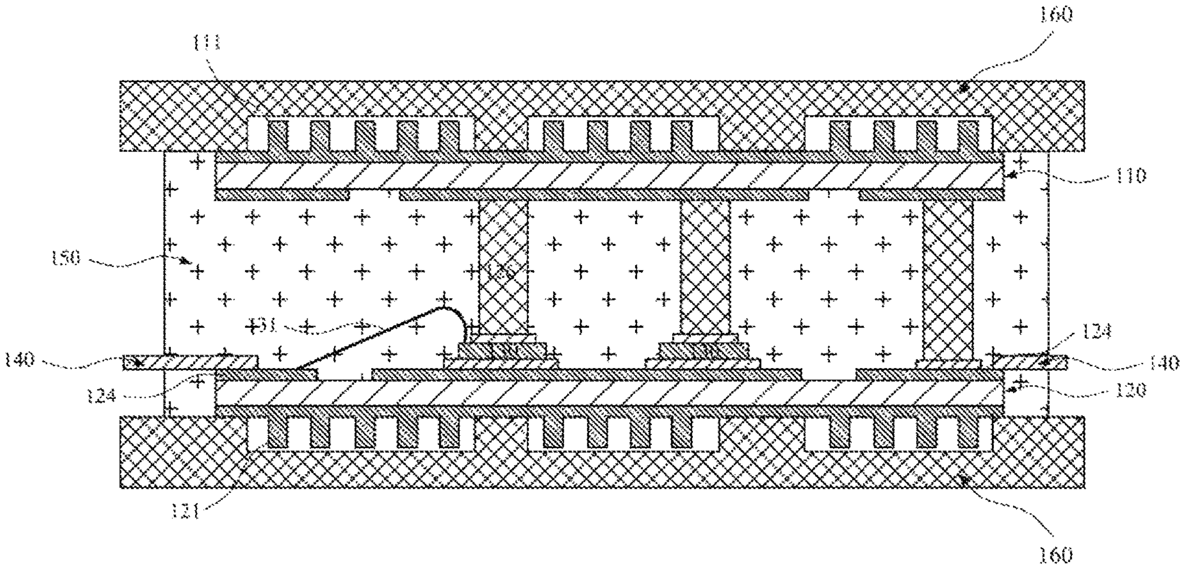
FIG. 7 illustrates a joining structure between heat release posts of the semiconductor package in FIG. 2 and a molding die.

Also, referring to FIG. 6, the lower substrate 120 may include one or more heat release metal layer 123, on which the heat release posts 121 are arranged, a non-conductive bonding layer 127 functioning as an insulating layer, one or more metal pattern layers 124 electrically connected to the semiconductor chips 130 on the non-conductive bonding layer 127, and one or more conductive bonding layers 125 formed on the upper surface or the lower surface of the semiconductor chips 130.

Next, the semiconductor chips 130 are bonded and installed onto the upper substrate 110 and/or the lower substrate 120 and are electrically connected to the metal pattern layers 114 and 124 of the upper substrate 110 and/or the lower substrate 120 by the electrical signal lines 131. Accordingly, an external signal may be applied to the semiconductor chips 130.

Also, the semiconductor chips 130 may be applied to devices such as inverters, converters, or on board chargers (OBC) which convert and control power by using Insulated Gate Bipolar Transistors (IGBT) or Metal-Oxide-Semiconductor Field-Effect Transistors (MOSFET) which are power semiconductor chips.

Next, the lead frames 140 contact and are electrically connected to the metal pattern layers 114 and 124 of the upper substrate 110 and/or the lower substrate 120 and receive an external signal.

The molding housing 150 partially or entirely covers a region of the upper substrate 110 and/or the lower substrate 120 to which the semiconductor chips 130 are not joined. Accordingly, while a structural form between the upper substrate 110 and the lower substrate 120 maintains, the upper substrate 110 and the lower substrate 120 are electrically insulated from each other.

Here, as the molding housing 150 is formed of an Epoxy Molding Compound (EMC), PBT, or PPS for insulation, the molding housing 150 covers, protects, and insulates at least a part of an inner circuit.

A semiconductor cooling system is watertight and is joined to the upper part (or the lower part) of the heat release posts 111 and 121 and a coolant circulating the semiconductor cooling system directly contact the uprightly-formed heat release posts 111 and 121. In this regard, an area contacting the coolant is enlarged so as to improve heat release efficiency. The coolant may be cooling water, a coolant fluid, refrigerant gas, or air. However, the present invention is not limited thereto and the coolant may include all kinds of cooling medium which is cold. Also, a cooling method may be water cooling or air cooling.

Figure 10:
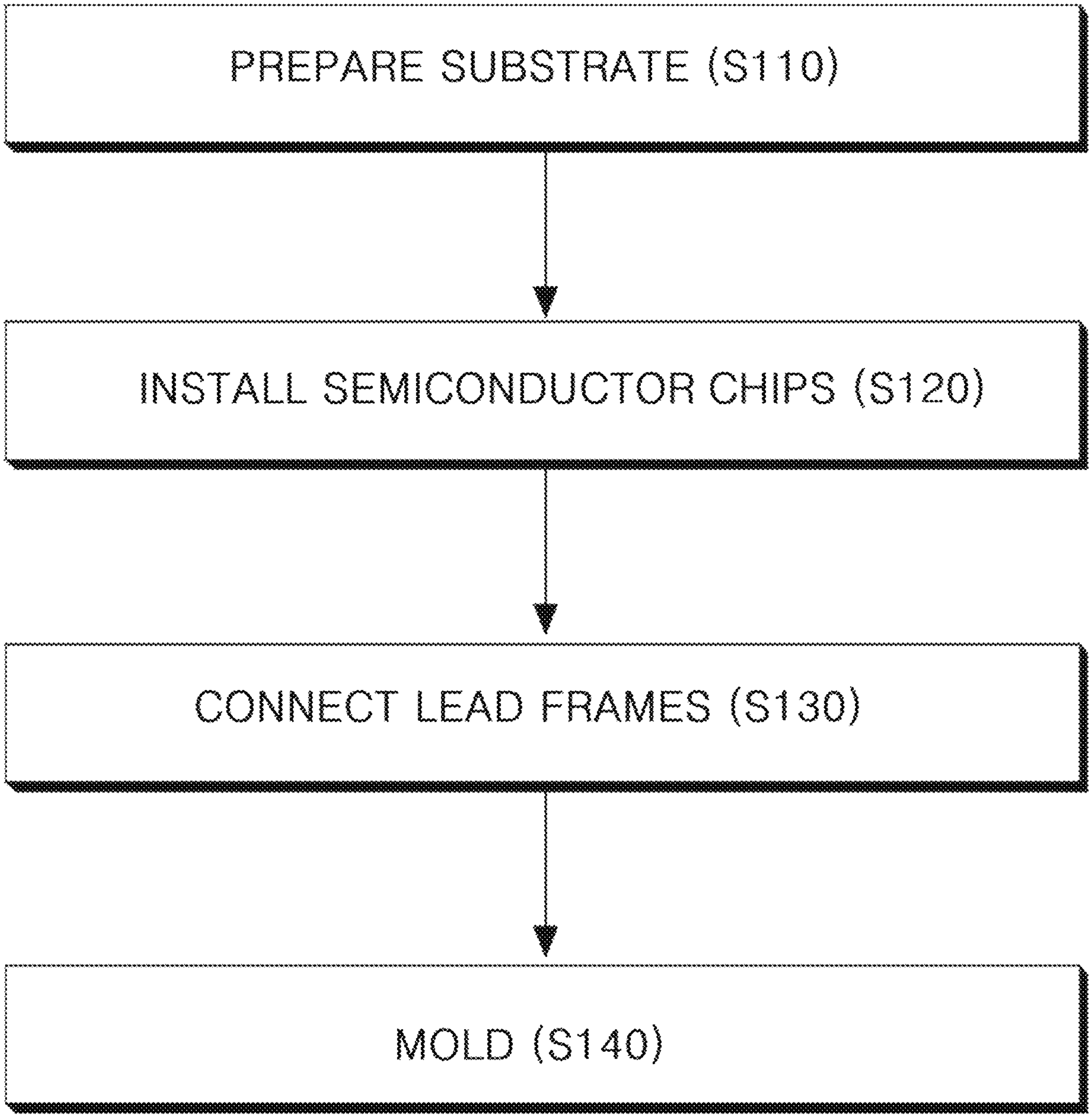
FIG. 10 is a flowchart illustrating a method of manufacturing a semiconductor package according to another embodiment of the present invention.

FIG. 10 is a flowchart illustrating a method of manufacturing a semiconductor package according to another embodiment of the present invention. The method of manufacturing a semiconductor package will be described in more detail below with reference to FIG. 10.

The method includes preparing the upper substrate 110 and/or the lower substrate 120, on which the plurality of heat release posts 111 and 121 is protruded and arranged in a matrix form, in operation S110, joining the semiconductor chips 130 on the upper substrate 110 and/or the lower substrate 120 and connecting together by using the electrical signal lines 131 in operation S120, electrically connecting the lead frames 140 to the upper substrate 110 and/or the lower substrate 120 in operation S130, and partially or entirely covering a region of the upper substrate 110 and/or the lower substrate 120, to which the semiconductor chips 130 are not joined, in operation S140.

Here, in preparing the substrates in operation S110, the heat release posts 111 and 121 are extended from the lower surface, the upper surface, or the lower and upper surfaces of the upper substrate 110 and/or the lower substrate 120 and stand upright by being exposed to the surface of the molding housing 150 at a certain height. Also, the mold distances D2 within the molding die 160 used to shape the molding housing 150 is greater than the post distances D1 between the heat release posts 111 and 121. Lines arranged to partially or entirely contact the surface of the molding die 160 include the penetration line L1 and/or the nonpenetration line L2, wherein the penetration line L1 penetrates the entire surface of the upper substrate 110 and/or the lower substrate 120 in a horizontal direction, and the nonpenetration line L2 is blocked by the heat release posts 111 and 121 and thereby, does not penetrate a part of the upper substrate 110 and/or the lower substrate 120 in a horizontal direction. While the molding housing 150 is molded by the molding die 160, the molding die 160 compresses one or more penetration lines L1 and/or one or more nonpenetration lines L2 to form the molding housing 150. Accordingly, the molding die 160 may directly and uniformly compress the upper substrate 110 and/or the lower substrate 120 where the heat release posts 111 and 121 are not arranged. In this regard, pressure applied to the substrates is raised and uniform and thus, a molding resin may be prevented from overflowing toward the surfaces of the heat release metal layers 113 and 123. Therefore, quality stability may be improved.

Here, the mold distances D2 may be greater than the post distances D1 by two times or above and the mold distances D2 may be in the range of 1 mm through 300 mm.

The heat release posts 111 and 121 may be formed of a metal having excellent thermal conductivity or may contain 40% or more of a metal component having excellent thermal conductivity.

The upper substrate 110 and/or the lower substrate 120 may include one or more heat release metal layers 113 and 123, on which the heat release posts 111 and 121 are respectively arranged, one or more insulating layers 112 and 122 respectively formed on the heat release metal layers 113 and 123, one or more metal pattern layers 114 and 124 formed on the insulating layers 112 and 122 and electrically connected to the semiconductor chips 130, and one or more conductive bonding layers 125 formed on the upper surface and/or the lower surface of the semiconductor chip 130. The heat release posts 111 and 121 may be formed of a material which is same as that of the heat release metal layers 113 and 123.

According to the semiconductor package and the method of manufacturing the same described above, areas on the surfaces of the heat release metal layers pressed by the molding die are expanded and the molding die directly and uniformly compresses the upper substrate or the lower substrate, each of which does not include the heat release posts, so that contamination of the substrate occurring due to a molding resin may be prevented and molding may be stably performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:

a lower substrate which comprises a plurality of heat release posts protruded and arranged thereon;

semiconductor chips joined onto the lower substrate and connected by electrical signal lines;

lead frames electrically connected to the lower substrate; and a molding housing partially or entirely covering a region of the lower substrate to which the semiconductor chips are not joined, wherein the heat release posts are extended downward from a lower surface of the lower substrate, wherein the lower surface of the lower substrate comprises:

a pair of upper post areas spaced apart from each other in an X-axis direction;

a pair of lower post areas spaced apart from each other in the X-axis direction, wherein the heat release posts are arranged on the upper and lower post areas;

a first pressing area interposed between the upper post areas and between the lower post areas and extended across the lower surface of the lower substrate in a Y-axis direction; and a second pressing area interposed between the upper post areas and the lower post areas and extended across the lower surface of the lower substrate in the X-axis direction, wherein the first and second pressing areas include no heat release post in order to be pressed by a molding die, and wherein a width of the pressing areas is greater than a post distance between two adjacent heat release posts in the post areas.

2. The semiconductor package of claim 1, wherein the width of the pressing areas is greater than the post distance by two times or above.

3. The semiconductor package of claim 1, wherein the width of the pressing areas is in the range of 1 mm through 300 mm.

4. The semiconductor package of claim 1, wherein the heat release posts are formed in circular columns, elliptic cylinders, or polygonal columns.

5. The semiconductor package of claim 1, wherein the heat release posts are formed of a metal or contain 40% or more of a metal component.

6. The semiconductor package of claim 1, wherein the lower substrate comprises an insulating layer.

7. The semiconductor package of claim 1, wherein the lower substrate comprises a heat release metal layer on which the heat release posts are arranged, a insulating layer on the heat release metal layer, a metal pattern layer electrically connected to the semiconductor chips, and one or more conductive bonding layers formed on an upper surface or a lower surface of the semiconductor chips.

8. The semiconductor package of claim 7, wherein the heat release posts are formed of a material which is same as that of the heat release metal layer.

9. The semiconductor package of claim 1, wherein the electrical signal lines are surface-bonding type conductive clips or post-shaped conductive spacers.

10. The semiconductor package of claim 1, wherein the molding housing is formed of an Epoxy Molding Compound (EMC).

11. The semiconductor package of claim 1, further comprising a semiconductor cooling system joined to a lower part of the molding housing and a coolant which circulates the semiconductor cooling system and directly contacts the heat release posts.

12. The semiconductor package of claim 11, wherein the coolant comprises cooling water, a coolant fluid, refrigerant gas, or air.

13. The semiconductor package of claim 6, wherein the insulating layer is formed of a single material comprising $Al_2O_3$, AlN, $Si_3N_4$, or SiC or a composite material comprising any one of $Al_2O_3$, AlN, $Si_3N_4$, and SiC.

14. The semiconductor package of claim 1, wherein the semiconductor chips are applied to on board chargers (OBC), inverters, or converters.

15. A semiconductor package comprising:

a lower substrate on which a plurality of heat release posts are arranged;

at least one semiconductor chip joined onto the lower substrate;

a lead frame electrically connected to the lower substrate; and a molding housing covering a region of the lower substrate to which the at least one semiconductor chip is not joined, wherein heat release posts are extended downward from a lower surface of the lower substrate, wherein the lower surface of the lower substrate comprises:

a post area on which the plurality of heat release posts are arranged;

a pair of first pressing areas spaced apart from each other in a Y-axis direction and extended across the lower surface of the lower substrate in the Y-axis direction; and a pair of second pressing areas spaced apart from each other in an X-axis direction and extended across the lower surface of the lower substrate in the X-axis direction, wherein the first and second pressing areas include no heat release post in order to be pressed by a molding die, and wherein a width of the first and second pressing areas is greater than a post distance between two adjacent heat release posts in the post area.

16. A semiconductor package comprising:

a lower substrate on which a plurality of heat release posts are arranged;

at least one semiconductor chip joined onto the lower substrate;

a lead frame electrically connected to the lower substrate; and a molding housing covering a region of the lower substrate to which the at least one semiconductor chip is not joined, wherein heat release posts are extended downward from a lower surface of the lower substrate, wherein the lower surface of the lower substrate comprises:

a pair of post areas spaced apart from each other in an X-axis direction, wherein the heat release posts are arranged on the post areas;

a first pressing area interposed between the post areas and extended across the lower surface of the lower substrate in an Y-axis direction; and a pair of second pressing areas spaced apart from each other in the X-axis direction and extended across the lower surface of the lower substrate in the X-axis direction, wherein the first and second pressing areas include no heat release post in order to be pressed by a molding die, and wherein a width of the first and second pressing areas is greater than a post distance between two adjacent heat release posts in the post areas.

* * * * *